United States Patent [19]
Kobatake

[11] Patent Number: 5,844,847
[45] Date of Patent: Dec. 1, 1998

[54] METHOD AND NONVOLATILE SEMICONDUCTOR MEMORY FOR REPAIRING OVER-ERASED CELLS

[75] Inventor: Hiroyuki Kobatake, Tokyo, Japan

[73] Assignee: NEC Corporation, Tokyo, Japan

[21] Appl. No.: 759,673

[22] Filed: Dec. 6, 1996

[30] Foreign Application Priority Data

Dec. 8, 1995 [JP] Japan .................................. 7-345876

[51] Int. Cl.$^6$ .................................................. G11C 11/34
[52] U.S. Cl. ............................... 365/185.29; 365/185.24; 365/185.3; 365/185.33; 365/218
[58] Field of Search ..................... 365/185.03, 185.09, 365/185.18, 185.22, 185.26, 185.29, 185.3, 185.33, 200, 218

[56] References Cited

U.S. PATENT DOCUMENTS

| | | | |
|---|---|---|---|
| 5,237,535 | 8/1993 | Mielke et al. | 365/218 |
| 5,377,147 | 12/1994 | Merchant et al. | 365/185.22 |
| 5,537,665 | 7/1996 | Patel et al. | 365/200 |
| 5,594,689 | 1/1997 | Kato | 365/185.22 |

FOREIGN PATENT DOCUMENTS

| | | |
|---|---|---|
| 3-230566 | 10/1991 | Japan . |
| 4-153999 | 5/1992 | Japan . |
| 4222994 | 8/1992 | Japan . |
| 5314783 | 11/1993 | Japan . |
| 7-57485 | 3/1995 | Japan . |
| 7-182877 | 7/1995 | Japan . |
| 7-249701 | 9/1995 | Japan . |

OTHER PUBLICATIONS

Japanese Office Action, Dated Apr. 7, 1998: Translation Attached.

*Primary Examiner*—David Nelms
*Assistant Examiner*—Trong Phan
*Attorney, Agent, or Firm*—McGinn & Gibb, P.C.

[57] ABSTRACT

In a nonvolatile floating gate memory cell array, memory cells can become over-erased wherein their threshold voltage becomes near zero volts or even slightly negative. To correct over-erased cells and raise their threshold voltages to a normal level, a nonvolatile memory includes a control circuit for applying a programming voltage (approximately 5V) to the bit lines of the memory cell array and a lower voltage (approximately 2V) to the word lines of the memory cell array. The lower voltage is selected to be less than the threshold voltage (e.g., 3V) for a normal cell such that normal cells are not affected. However, the cells in an over-erased state will become active by the lower threshold voltage and begin conducting. A channel current flows to the over-erased memory cells and channel hot electrons induced by this channel flow into the floating gate of the memory cell raises the threshold voltage (VTM) of the memory cell to a normal level.

24 Claims, 9 Drawing Sheets

METHOD AND NONVOLATILE SEMICONDUCTOR MEMORY FOR REPAIRING OVER-ERASED CELLS

BACKGROUND OF THE INVENTION

1. Field of the Invention

The present invention generally relates to a nonvolatile semiconductor memory, and more particularly to a method and nonvolatile semiconductor memory having floating gates, for electrically writing, erasing and repairing an over-erased cell.

2. Description of the Related Art

A conventional nonvolatile semiconductor memory has a memory cell array where a plurality of electrically writeable and erasable memory cells ($M_{11}$ through $M_{mn}$) wherein "m" is preferably an integer greater than 1, each having a floating gate, are arrayed in row and column directions. A plurality of word lines ($W_1$ through $W_m$) connect the memory cells in the row directions, and a plurality of bit (digit) lines ($D_1$ through $D_n$) connect the memory cells in the column directions.

An X decoder is provided for selecting the word lines ($W_1$ through $W_m$) with an address signal $A_{dd}$ as an input, and a Y decoder is provided for selecting the bit (digit) lines ($D_1$ through $D_n$) with the address signal as an input. A sense amplifier reads out data stored in the memory cells, a write circuit writes data to the memory cells in accordance with input data $D_{in}$, and an erase circuit erases data written to the memory cells.

After being erased, the threshold voltage (VTM) of a memory cell varies largely between memory cells, as shown for example in FIG. 6. Although there are very few cases, memory cells whose VTM is less than zero or near zero volts exist. Memory cells having a VTM less than or near zero volts are called "over-erased cells". An "over-erased cell" is a cell in its depletion state where the threshold voltage of a memory cell becomes a negative value due to erasing time being too long.

A problem arises when an over-erased cell exists within a cell array. Specifically, since the VTM is less than 0 volts even when the word lines are in the non-selected state of 0 volts, the over-erased cell continues to keep its "on" state. Therefore, only data (e.g., "1") corresponding to a cell in the "on" state (conductive state) is output from the bit line connected to the over-erased cell and, for example, even when the cell in an "off" state is selected, "0" is not output and it becomes substantially impossible to read out correct data.

Solutions to the over-erased problem have been proposed, for example, in Japanese Patent Application Laid-Open No. 4-222994 in which a method of redressing an over-erased cell attempts to repair an over-erased memory cell back to a normal state.

The method includes detecting the existence of an over-erased cell after an erasing operation. When an over-erased cell exists, all word lines ($W_1$ through $W_m$) are made to have a "high" (programming) voltage of, for example, 12V. With this step, electrons are poured into the floating gate of the memory cell due to a "tunneling" phenomenon, whereby the VTM of the cell in the over-erased state is made to rise to a positive threshold in order to repair the over-erased cell.

Unfortunately, since this conventional method pours electrons by the "tunneling" phenomenon into all cells of the memory cell array, writing is performed even with respect to normal cells which are not over-erased. This is a problem.

The VTM of the cells has risen by the time the over-erasion correction writing period has ended. As a result, reading speed is reduced and, at worst, the reading operation may become defective. Therefore, the process of erasing and then detecting the existence of an over-erased cell is again repeated until all over-erased cells are repaired.

Another problem is that the over-erasion correction method of Japanese Patent Application Laid-Open No. 4-222994, performs simultaneously the correction of all over-erased cells existing within a memory cell. However, processing such as erasing and detection of the existence of an over-erased cell must be performed repetitively after over-erasion correction writing is performed.

Furthermore, this processing sequence must be executed repeatedly until all over-erased cells are removed. Hence, correcting over-erased cells by this method is lengthy. Additionally, a control circuit for executing the sequence control for correcting over-erased cells is complicated, and because of an increase in the circuit scale, the aforementioned method requires a very large chip area for implementation on a semiconductor chip.

Furthermore, as explained above, pouring of electrons due to the "tunneling" phenomenon is used for over-erased cell correction. However, as compared to using "channel hot electrons" (electrons having a stronger energy and located in the channel region under the gate) which takes a few tens of microseconds, the pouring of electrons due to the "tunneling" phenomenon (which takes a few milliseconds) is about 100 times slower. This greatly lengthens the time required for correcting over-erased cells.

Similarly, Japanese Patent Application Laid-Open No. 5-314783 provides a method for correcting an over-erased cell by first detecting the existence of an over-erased cell for each bit line for each cell connected to a word line $W_1$ where erasing has been performed. An over-erased cell is repaired by continuously applying a writing pulse under a voltage weaker than a normal writing voltage (e.g., 4V for bit lines and 6V for word lines) until the over-erased state is corrected.

Because this method performs over-erasure correction writing for each bit, the voltage of a word line (e.g., $W_1$) is set and the voltages of bit lines ($D_1$ through $D_n$) where over-erased cells exist are set in sequence. That is, each column address (bit line) is judged for whether an over-erased cell exists. When an over-erased cell exists, an over-erasion correction writing process is performed wherein a writing pulse is applied under a condition (for example, 4V for bit lines and 6V for word lines) weaker than a normal writing voltage, until the over-erased state is corrected.

Additionally, the over-erasure correction method of Japanese Patent Application Laid-Open No. 5-314783, adopts the over-erasure correction writing based on hot channel electrons, and therefore the time required for correcting one over-erased cell is shorter than if the tunneling phenomena was used. However, the correction writing needs to be performed for each bit, and in the case of a large storage capacity, correcting all over-erased cells is lengthy.

Further, as with the above-mentioned Japanese Patent Application Laid-Open No. 4-222994, the control circuit for executing the sequence control for correcting over-erased cells is complicated, and again takes up valuable chip real estate.

Furthermore, U.S. Pat. No. 5,237,535 to Mielke et al., herein incorporated by reference, shows an operation for detecting the existence of an over-erased cell for each bit and repairing the over-erased cell by writing in sequence for each of the word lines, this writing operation is performed for each bit line, and all over-erased cells existing within a memory cell array are corrected.

This method performs the correction of an over-erased cell by writing under a voltage weaker than a normal writing voltage similarly to Japanese Patent Application Laid-Open No. 5-314783, and a reduction in the over-erasion correction writing period is performed by applying a write voltage $V_{pp}$ which is given as $V_{pp}=V_{start}+(V_{step\cdot count})$ and proportional to a step count.

In U.S. Pat. No. 5,237,535, the time required for correcting one over-erased cell is further shortened by applying a write voltage $V_{pp}$ which rises in proportion to a step count. However, the sequence control for over-erasion correction writing is more complicated and the control circuit is extremely complex, and thus providing such a circuit on a chip requires a large amount of chip space.

Also, in this method, the correction writing must be performed for each bit. Therefore, in a very large capacity memory, as with the method proposed in the aforementioned Japanese Patent Application Laid-Open No. 5-314783, a long time is required for correcting all over-erased cells.

SUMMARY OF THE INVENTION

In view of the foregoing problems of the conventional systems, it is an object of the present invention to provide a method and nonvolatile semiconductor memory which includes memory cells having floating gates wherein the correction of over-erased cells is performed rapidly and chip area is reduced.

According to a first aspect of the invention, a nonvolatile semiconductor memory includes a plurality of memory cells arrayed in row and column directions, a plurality of first lines for connecting the memory cells in the row direction, a plurality of second lines for connecting the memory cells in the column direction, an erase circuit for erasing data written to the memory cells, and a controller for applying a first voltage to the plurality of second lines and biasing the plurality of first lines to a second voltage less than a voltage which is set when the first lines are read-out.

Preferably, the controller circuit (and method), after erasing, applies a predetermined high voltage to all of the bit lines simultaneously and biases all of the word lines to a predetermined voltage simultaneously so that memory cells in an over-erased state are repaired simultaneously, the predetermined voltage being less than a voltage which is set when the word lines are read-out.

In a second aspect, the non-volatile semiconductor memory further includes a circuit (and method) for detecting the existence of an over-erased cell after erasing and which, when the over erased cell exists, applies a predetermined high voltage to all of the bit lines simultaneously and biases all of the word lines to a predetermined voltage simultaneously, so that those memory cells in an over-erased state, are repaired simultaneously. The predetermined voltage is less than a voltage which is set when the word lines are read-out.

Furthermore, in a third aspect of the present invention, the nonvolatile semiconductor memory may include a circuit (and method) which applies a predetermined high voltage to all of the bit lines, segments the memory cell array into a plurality of blocks in the bit line directions and sequentially biases the word line of each block to less than a voltage which is set when the word lines are read-out simultaneously, to repair over-erased memory cells.

With the unique and unobvious structure and method of the present invention, over-erasure correction writing is performed simultaneously with respect to all over-erased cells in a memory cell array. Furthermore, the writing is performed by the pouring of "channel hot electrons" which is about 100 times faster than the pouring of electrons based on the "tunneling" phenomenon. Thus, the time for correcting over-erased cells is considerably shortened.

Also, in the over-erasion correction writing of the present invention, the voltage applied to the word lines is less than a voltage which is set when the word lines are read-out. Therefore, current flowing through one cell is very small (e.g., preferably in a range of 10–20 $\mu$A). Additionally, the number of over-erased states or memory cells in a very low threshold voltage state is, in reality, a very small number. Therefore, power which is consumed during the over-erasion correction writing period will not be great.

Furthermore, according to the present invention, after the threshold voltage VTM of an over-erased cell rises during the over-erasion correction writing period, it converges to a value (e.g., VTM=2V) which is controlled by a voltage applied to the word lines, and thus the threshold voltage VTM of a normal cell will not substantially vary.

Therefore, with a single over-erasion correction writing, all the cells in the memory cell array reach a normal threshold voltage VTM. Thus, after over-erasion correction writing, sequence control, such as a re-erasing process for correcting a rise in the threshold voltage of a normal cell, is not required and erasing ends immediately. Therefore, the time required for correcting an over-erased cell is shortened, and when over-erased cells are detected, only a single over-erasion correction writing operation is required. Thus, the processing sequence is very simple, the control circuit of the present invention is structurally very simple, and the circuit scale and the chip area can be reduced, and the VTM of a normal cell will not vary during over-erasion correction writing period. Therefore, even if over-erasion correction writing is executed when only normal cells are present, the threshold voltages VTM of the normal cells are still not affected. Thus, a sequence operation may be omitted when the existence of an over-erased cell is detected, and over-erasion correction writing is executed only when an over-erased cell exists.

Additionally, a current flowing during an over-erasion correction writing period can be reduced when the over-erased cells existing in the memory cell array are repaired several times. Thus, the width of the voltage source/GND (ground) wiring can also be reduced, thereby reducing the chip area.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1:
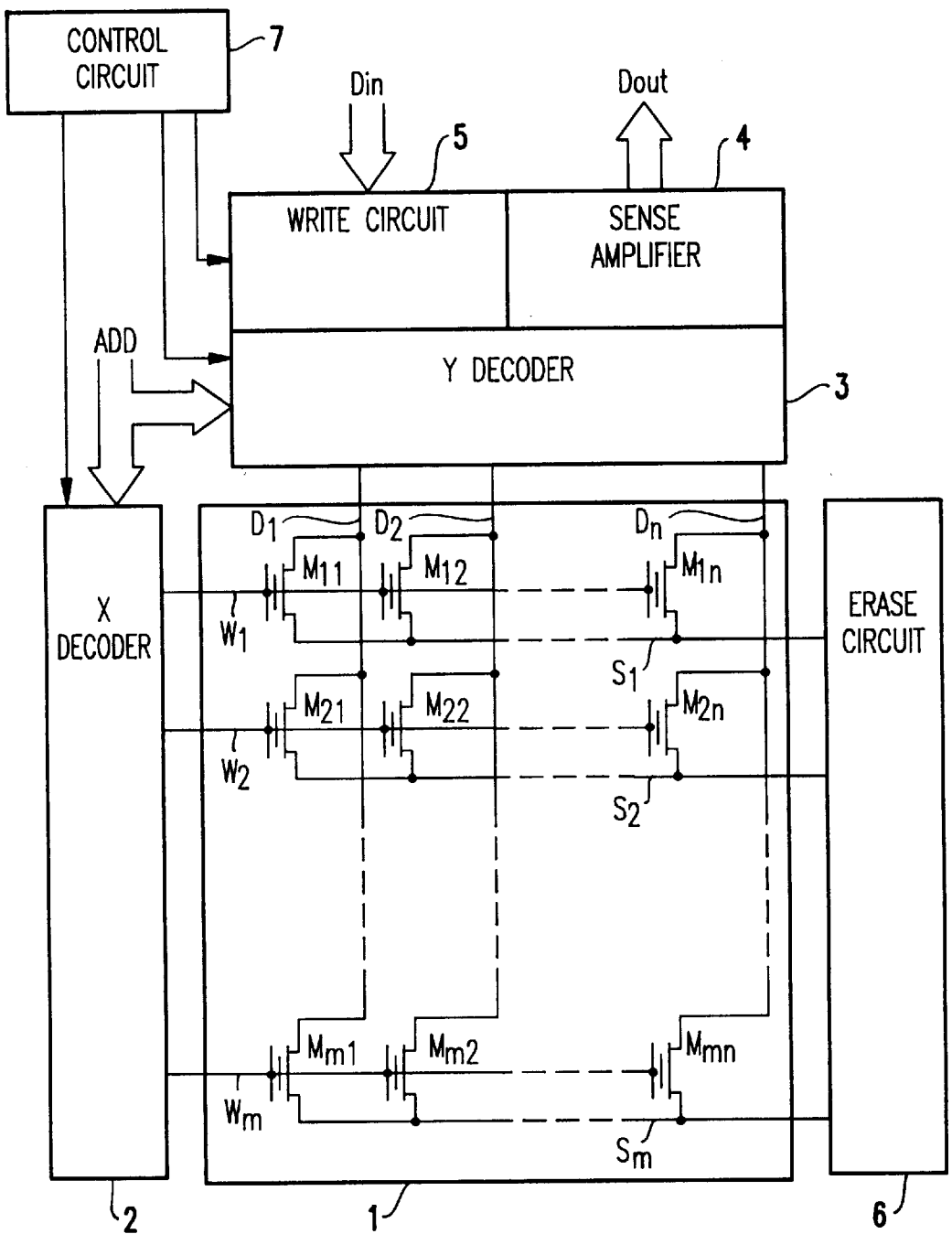
FIG. 1 is a block diagram of an exemplary nonvolatile semiconductor memory for implementing the over-erased cell correction structure and method according to the present invention.

Referring now to the drawings, and more particularly to FIG. 1, there is shown is a block diagram showing a nonvolatile semiconductor memory which can accommodate the over-erasing correction structure and method according to the embodiments of the present invention.

Referring to FIG. 1, the nonvolatile semiconductor memory for accommodating the over-erasing correction structure and method according to the embodiments of the present invention has a memory cell array 1 where a plurality of electrically writeable and erasable memory cells ($M_{11}$ through $M_{mn}$) each having a floating gate are arrayed in row and column directions, a plurality of word lines ($W_1$ through $W_m$) which connect the memory cells in the row directions, a plurality of bit lines ($D_1$ through $D_n$) which connect the memory cells in the column directions, an X-decoder 2 for selecting the word lines ($W_1$ through $W_m$) with an address signal $A_{dd}$ as an input, a Y-decoder 3 for selecting the bit lines ($D_1$ through $D_n$) with the address signal as an input, a sense amplifier 4 for reading out data stored in the memory cells, a write circuit 5 for writing data to the memory cells, and an erase circuit 6 for erasing data written to the memory cells.

The nonvolatile semiconductor memory according to the embodiments has, in order to redress (e.g., repair) an over-erased cell after erasing, a control circuit 7 for controlling an operation of applying a high voltage to a bit line by the Y-decoder 3 and the write circuit 5 and an operation of biasing a word line to a voltage less than the voltage which is set when the word line is read out by the X-decoder 2. The structures of the individual components of the X-decoder 2, the Y-decoder 3, the sense amplifier 4, the write circuit 5, and the erase circuit 6 are believed to be well within the grasp of one of ordinary skill in the art within the purview of the present application, and thus for brevity the structures will not be discussed in detail here in FIG. 1.

In the nonvolatile semiconductor memory according to the present invention, when data is written to a memory cell (e.g., $M_{11}$), a programming voltage (e.g., 5V) is applied from the write circuit 5 through the Y decoder 3 to a bit line ($D_1$), and a high voltage (e.g. 12V) is applied to a word line ($W_1$) by the X-decoder 2. Therefore, a channel current flows to a memory cell ($M_{11}$) and the channel hot electrons are induced by this channel flow into the floating gate of the memory cell, so that the threshold voltage VTM of the memory cell rises.

On the other hand, when written data is erased, an erasing voltage (for example, 12V) is applied to source lines ($S_1$ through $S_m$) by the erase circuit 6 and word lines ($W_1$ through $W_m$) are biased to zero volts by the X-decoder 2, whereby the electrons stored in the floating gate are pulled out to the source side. With this, the threshold voltages VTM of the memory cells are reduced (typically by 2V–3V). In this case, all the source lines ($S_1$ through $S_m$) in the memory cell 1 have been biased to a relatively high voltage (e.g., 12V), so that all of the memory cells ($M_{11}$ through $M_{nm}$) in the memory cell array 1 are erased.

Also, when stored data is read-out, a word line (W1) connected to the selected memory (e.g., $M_{11}$) is biased, for example to 5 V, and a bit line ($D_1$) and the sense amplifier 4 are connected together through the Y decoder 3. With this, stored data ($D_{out}$) is output from the sense amplifier 4.

First Embodiment

Figure 2:
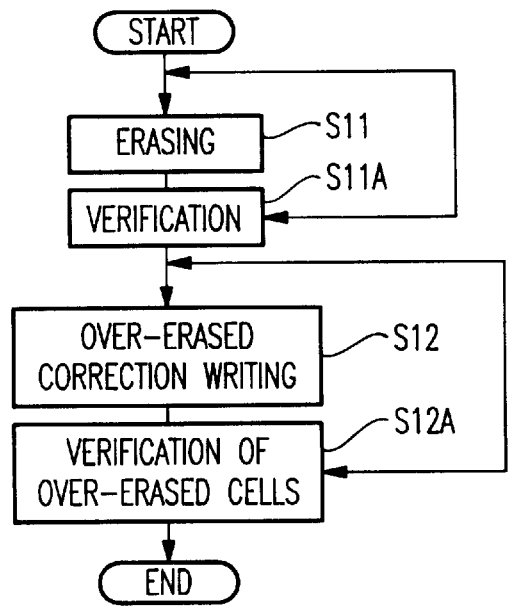
FIG. 2 is a diagram showing a processing sequence of repairing an over-erased cell in a first embodiment of the present invention.

Referring to FIG. 2, there is shown a first embodiment of the present invention, which can be incorporated into the nonvolatile semiconductor memory shown in FIG. 1. Accordingly, the description of the semiconductor memory which is the same as FIG. 1 is therefore omitted.

This embodiment comprises a sequence operation including erasing a cell in step S11. After erasing, a first verification process may be (typically is) performed in step S11A and if any cells have not been erased, then the process reverts back to step S11. If all of the cells have been erased, then in step S12 of the over-erased correction writing of this embodiment, control circuit 7 controls so that a programming (high) voltage, such as 5V, is applied to all bit lines $D_1$ through $D_m$ and, simultaneously, all word lines $W_1$ through $W_m$ are biased to a voltage (e.g., 2V) less than a voltage which is set when the word lines are read-out. As a result, the threshold voltage VTM of only those cells in an over-erased state rises, and the over-erased state is corrected as mentioned in greater detail below with regard to the second embodiment. Thereafter, verification of the over-erased cells is performed in step S12A.

It is noted that the first verification step (e.g., step S11A) is different from the second verification step (e.g., step S12A) in that the first verification step applies a reading voltage (e.g., 5V) to the cells whereas in the second verification a "0" voltage is applied to verify the repair of the over-erased cells.

Further, as explained below, in the first embodiment there is no possibility that the VTM of a normal cell varies during the over-erasion correction writing period. Therefore, even if over-erasion correction writing is executed in a state where no over-erased cells exist, the threshold voltages VTM of the cells do not vary. Thus, a sequence operation is omitted in which the existence of an over-erased cell is detected, and over-erasion correction writing is executed only when an over-erased cell exists.

Thus, in the first embodiment, the existence of an over erased cell is not first determined, but instead the first embodiment simply applies a correcting voltage to all cells, whether they need correcting or not.

With the omission of the sequence operation of detecting the existence of an over-erased cell, the over-erasion writing period is simplified, and a control sequence of detecting the existence of an over-erased cell and starting over-erasion correction writing only when an over-erased cell exists becomes unnecessary. Therefore, the control circuit 7 is very simple, and takes up little area on a chip.

Figure 3A:
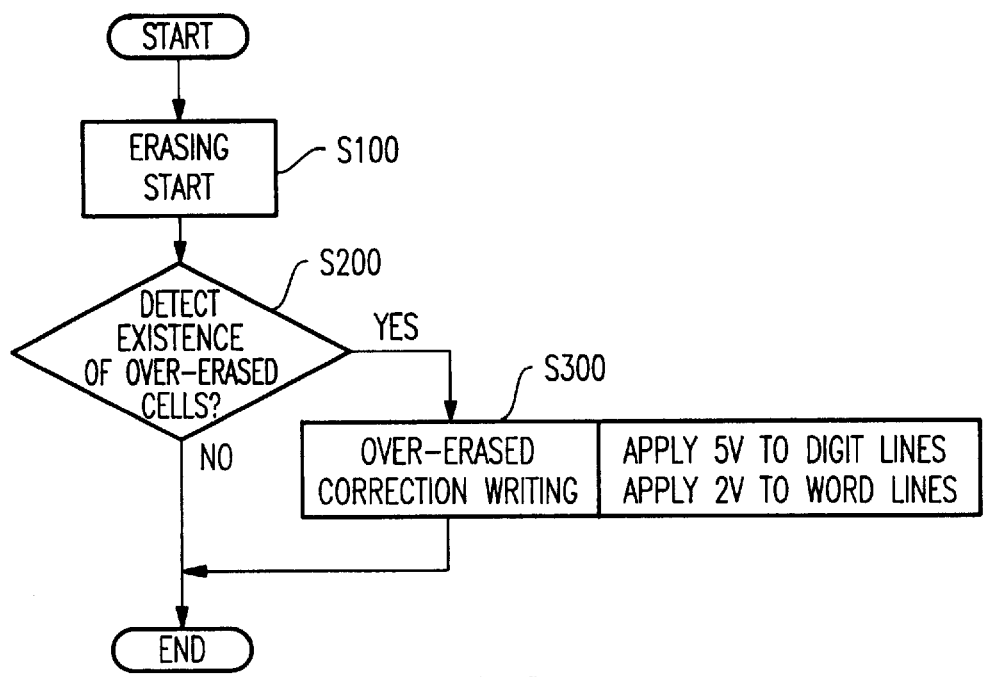
FIG. 3A is a flow diagram showing a processing sequence of redressing (e.g., repairing) an over-erased cell in a second embodiment of the present invention.
Figure 3B:
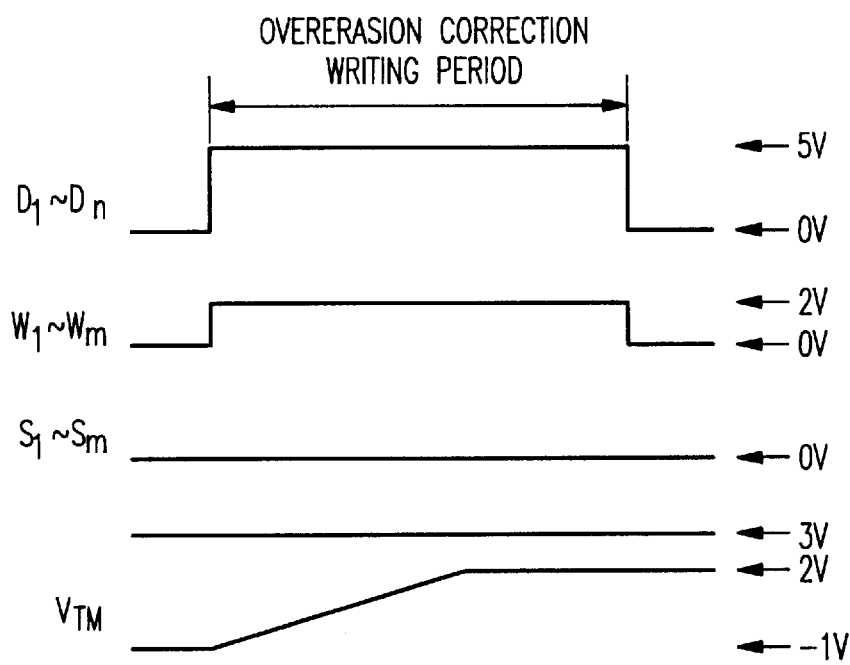
FIG. 3B is a timing diagram for explaining a processing operation of repairing an over-erased cell in the second embodiment of the present invention.
Figure 3C:
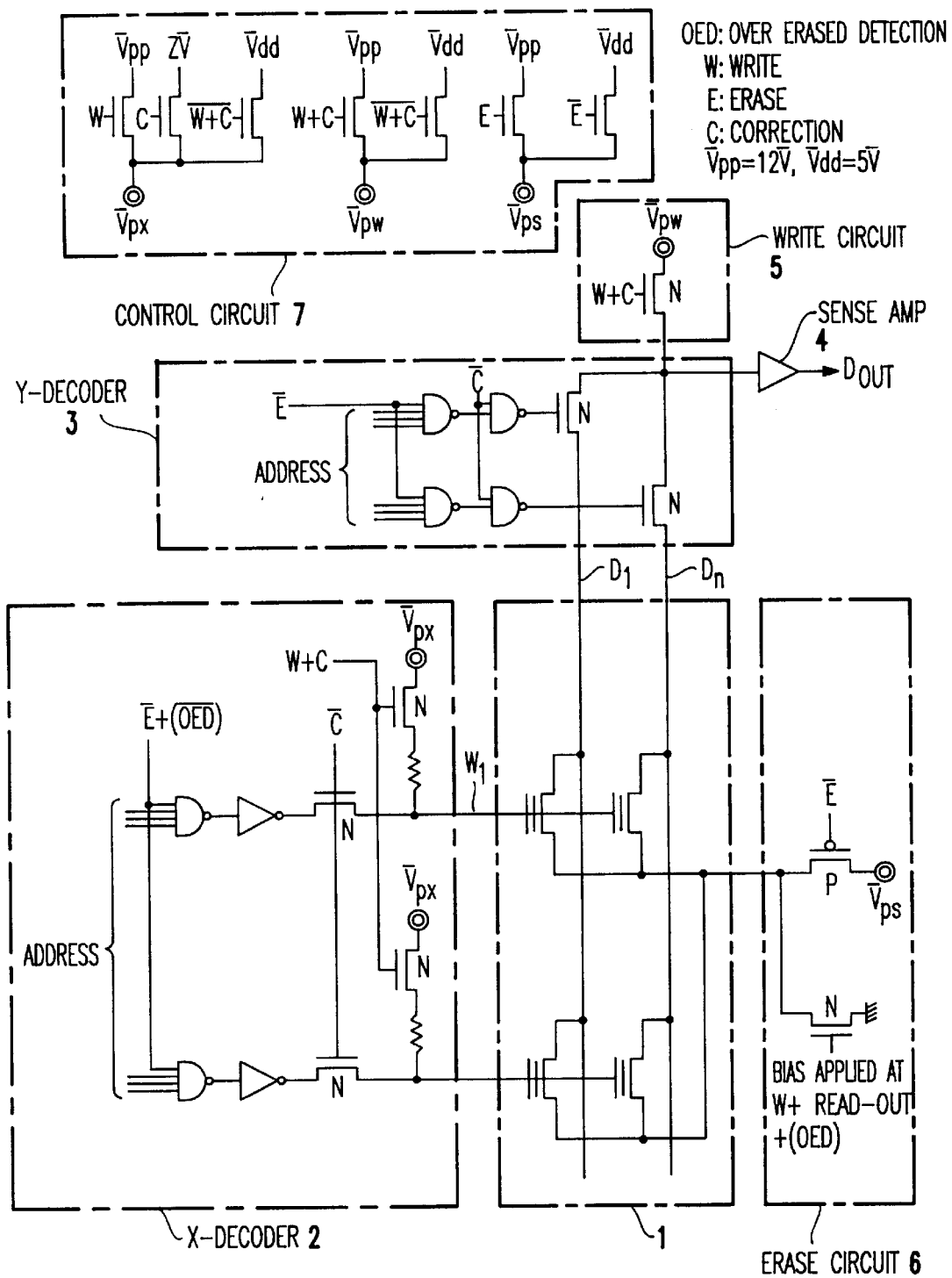
FIG. 3C illustrates a circuit for use with performing the methods of the first and second embodiments.

An exemplary circuit diagram for the first embodiment is shown in FIG. 3C including the memory cell array 1, the X-decoder 2, the Y-decoder 3, the sense amplifier 4, the write circuit 5, the erase circuit 6, and the control circuit 7 for controlling the above-mentioned circuits of the semiconductor memory through issuance of signals thereto, and is discussed briefly below.

Briefly, the cells are first erased by application of an erasing voltage controlled by the control circuit 7 through the erase circuit. That is, when written data is erased, an erasing voltage (for example, $V_{PS}$ which may be 12V) is applied to source lines $S_1$ through $S_m$ by the erase circuit 6 and word lines $W_1$ through $W_m$ are biased to zero volts by the X-decoder 2 with the circuitry shown, whereby the electrons stored in the floating gate are pulled out to the source side. Hence, the threshold voltages VTM of the memory cells are reduced. In this case, all the source lines $S_1$ through $S_m$ in the memory cell array 1 have been biased to a relatively high voltage (e.g., 12V), so that all of the memory cells $M_{11}$ through $M_{nm}$ in the memory cell array 1 are erased. It is noted again that, with the first embodiment, no detection of over-erased cells is performed prior to over-erasure correction writing.

Conversely, when data is written to a memory cell (e.g., $M_{11}$), the control circuit 7 controls so that a programming voltage (e.g., 5V) is applied from the write circuit 5 through the Y decoder 3 to a bit line ($D_1$), and a high voltage (e.g. 12V) is applied to a word line ($W_1$) by the X decoder 2. It is noted that the write circuit 5 is applied with a 5V or 0V depending upon whether the write circuit 5 is writing data or not. Therefore, as mentioned above, a channel current flows to a memory cell ($M_{11}$) and the channel hot electrons are induced by this channel flow into the floating gate of the memory cell, so that the threshold voltage VTM of the memory cell rises.

It is noted that for the verification steps of the first embodiment, the first verification step applies a reading voltage (e.g., 5V) to the cells whereas in the second verification a "0" voltage is applied to verify the repair of the over-erased cells. Specifically, a word line (W1) connected to the selected memory cell (e.g., $M_{11}$) is biased, for example to 5V, and a bit line ($D_1$) and the sense amplifier 4 are connected together through the Y-decoder 3. With this, the first verification is performed and stored data ($D_{out}$) is output from the sense amplifier 4, as shown in FIG. 3C.

As mentioned above, the first embodiment does not first detect over-erased cells, but instead the first embodiment simply applies a correcting voltage to all cells, whether they need correcting or not.

Second Embodiment

Referring now to FIGS. 3A and 3B, there is shown a flow diagram and voltage timing charts for redressing an over-erased cell produced by an erasing operation in step S200. Further, FIG. 3C illustrates the circuit diagram of a circuit for use with the second embodiment (as well as the first embodiment as discussed above) of the present invention.

Figure 3D:
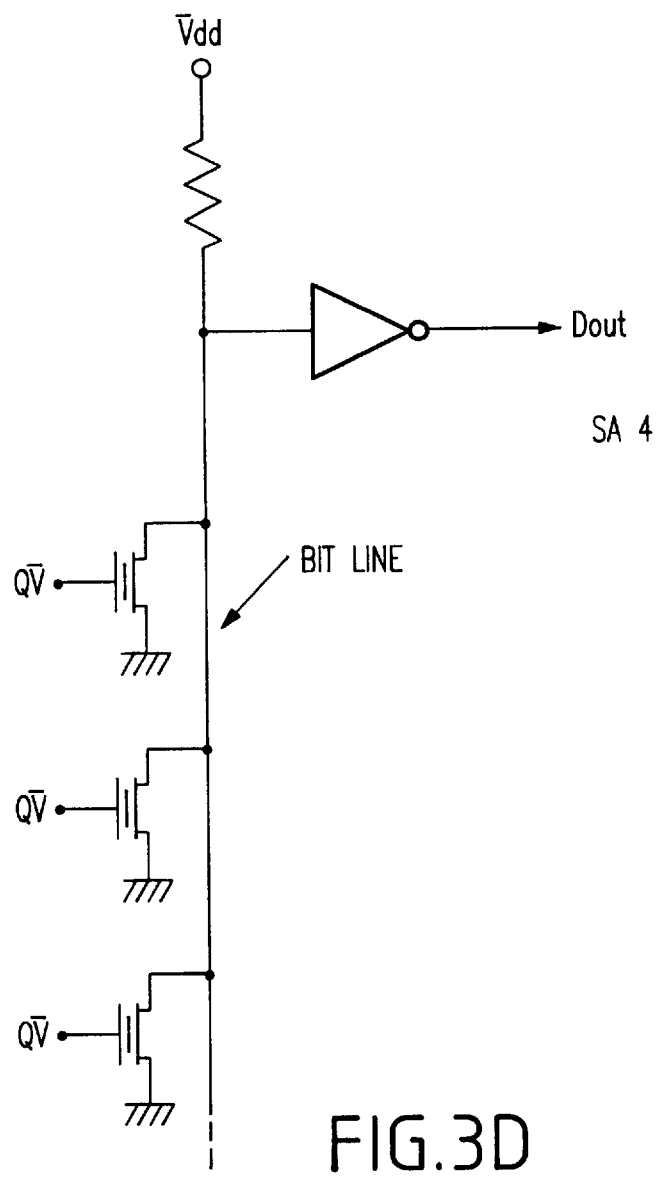
FIG. 3D illustrates a structure used for a detection method for use with the present invention.

In step S200 of FIG. 3A, the existence of an over-erased cell is detected. Detection of the over-erased cell may be performed, for example, by setting QV (applied to the cells as shown in FIG. 3D) to 0V. In an over-erased cell, VTM<QV. Thus, when an over-erased cell exists, the bit line is pulled down by the over-erased cell. Thus, $D_{out}$ from sense amplifier 4 goes "High". If no over-erased cell exists, then $D_{out}$ is "Low".

If an over-erased call does not exist, the processing ends. However, if an over-erased cell exists, the processing proceeds to step S300. In step S300, over-erased correction writing is performed, as discussed below. The process of the second embodiment will end after over-erasure correction writing is performed in step S300. It is noted that, while not illustrated in FIG. 3A, verification may be performed (similarly to step S12A in FIG. 2 discussed above) between step S300 and the end of processing.

In the over-erasion correction writing in step S300, as shown in FIG. 3(B), control circuit 7 controls so that a programming voltage (e.g., 5 V) is applied to all bit lines $D_1$ through $D_n$ in the memory cell array 1 simultaneously, and all word lines ($W_1$ through $W_m$) memory cells are biased simultaneously to a predetermined voltage (e.g., 2V) less than a voltage (e.g., 5V) which is set when the word lines are read out.

In this case, the VTM of an over-erased cell is relatively low (e.g., as mentioned above on the order of VTM=−1V). Therefore, if the control gate of the over-erased cell is biased to 2V, a channel current will flow, and the channel hot electrons induced by the channel current will be poured into the floating gate, so that the VTM gradually rises. The rise in the threshold voltage VTM of the memory cell continues during the time a cell in the over-erased state is turned "on" and a channel current flows. When the VTM has risen to the word line voltage of 2V, the cell is turned "off" and the rise in VTM is stopped.

On the other hand, because the VTM of a normal cell is 3V (relatively high), the cell is not turned "on" even if the control gate is biased to 2V. Therefore, a channel current also does not flow and channel hot electrons are not induced in the normal cell. Thus, the VTM will not vary during the over-erasion correction writing period.

According to the second embodiment of the present invention, over-erased correction writing is performed simultaneously with respect to all over-erased cells which exist within a memory cell array, and furthermore, the writing is performed by the pouring of channel hot electrons, which is about 100 times faster than the pouring of electrons based on the "tunneling" phenomenon.

Further, the second embodiment reduces programming time, since only the cells which have an over-erased state are corrected. Specifically, detection takes approximately 100–200 ns and the correction speed is 1–2 seconds. Therefore, the time required for correcting over-erased cells is considerably shortened compared to the first embodiment since 1–2 seconds will be saved if no correction needs to be performed.

Incidentally, because the over-erasion correction writing in the second embodiment uses channel hot electrons which are induced by causing a channel current to flow through an over erased cell, one would normally consider that the power consumed during over erasion correction writing period will become large. However, since the voltage of 2V applied to the word lines is less than the reading voltage of 5V which is set when the word lines are read-out, the current flowing through one cell is very small.

Figure 6:
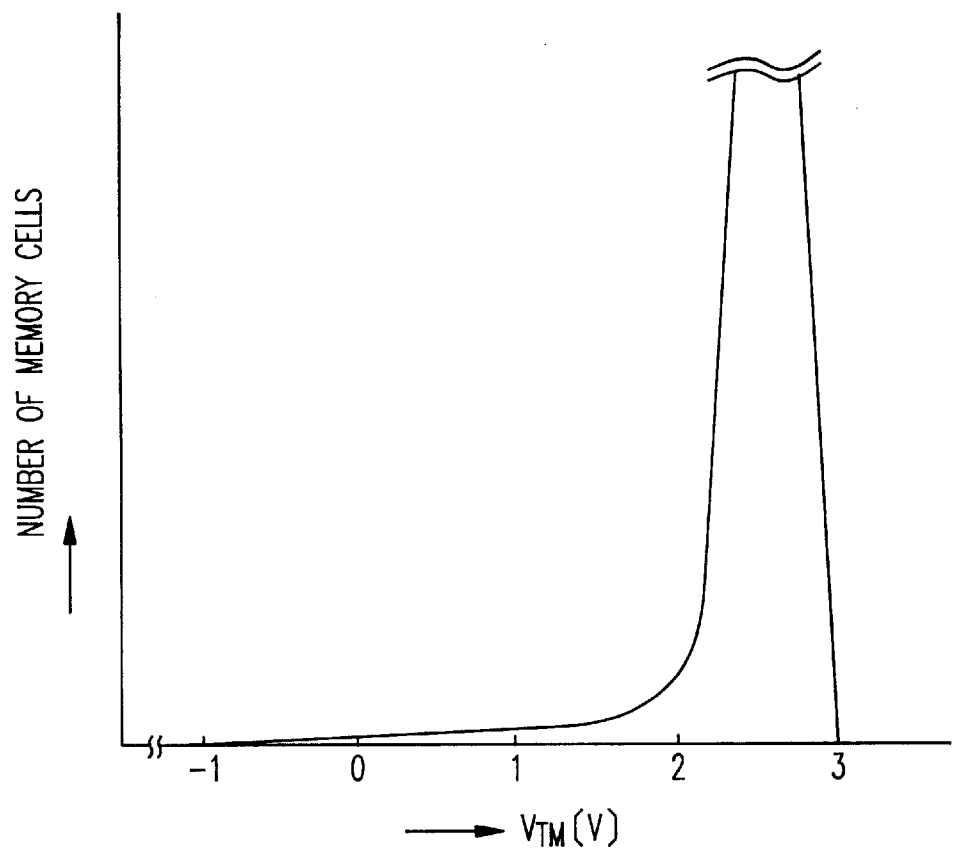
FIG. 6 is a diagram showing an example of a VTM distribution after erasion.

Additionally, as mentioned above, the number of over-erased states or memory cells in a very low threshold voltage state is usually a very small number, as shown in FIG. 6. Therefore, as a practical matter, the power consumed during the over-erasion correction writing period is not problematic.

Furthermore, according to the present invention, after the threshold voltage VTM of an over-erased cell rises during the over-erasion correction writing period, it converges to a value (e.g., VTM=2 V) which is controlled by a voltage applied to the word lines, and the threshold voltage VTM of a normal cell will not substantially vary (if at all). Therefore, with a single over-erasion correction writing, all the cells in the memory cell array reach a normal VTM. Hence, in this embodiment, after over-erasion correction writing, sequence control, such as a re-erasing process for correcting a threshold voltage rise in a normal cell, is not required, and erasing ends immediately. Therefore, the time required for correcting an over-erased cell is considerably shortened, especially compared to the conventional methods.

Further, as mentioned above, when over-erased cells are detected, only a single over-erasion correction writing operation is required. Thus, the processing sequence is very simple. Hence, a control circuit (see the control circuit 7 of FIG. 3C) for executing this sequence is not complex. Thus, the circuit scale is reduced, and the control circuit may be built compactly, so as not to consume much chip real estate.

FIG. 3C illustrates an exemplary circuit diagram which is for use with the nonvolatile semiconductor memory 1 and methods of the first and second embodiments of the present invention, and which illustrates the inputs of the various control voltages (and their origins) from the control circuit 7 to the various circuits of the semiconductor memory.

First, it is noted, for example, that the following exemplary voltages are provided for the present invention. For example, in a write mode, the word lines are applied with 12V, the source lines are floating, and the bit lines are at 5V or 0V. In the erasing mode, the word lines are at 0V and the source lines are at 12V, whereas in the reading mode the word lines are at 5V and the source lines are at 0V.

Briefly, erasing is performed by control circuit 7 controlling so that an erasing voltage of 12V is applied to source lines $S_1$ through $S_m$ by the erase circuit 6 and word lines ($W_1$ through $W_m$) are biased to zero volts by the X decoder 2, whereby the electrons stored in the floating gate are pulled out to the source side. Hence, the threshold voltages VTM of the memory cells are reduced. Since all the source lines ($S_1$ through $S_m$) in the memory cell 1 have been biased to a relatively high voltage (e.g., 12V), all of the memory cells ($M_{11}$ through $M_{nm}$) in the memory cell array 1 are erased.

Then, the existence of an over-erased cell is detected by the circuit of FIG. 3C through the use of the OED (over-erased detection) signal shown in FIG. 3C generated through the X-decoder 2 to the word lines and ultimately to control circuit 7. During over-erasure detection (as well as during writing and read-out), a bias voltage is applied to the erase circuit 6.

Thereafter, over-erasion correction writing is performed for the defective cell(s). Defective cells are applied with the high correcting (programming) voltage. Specifically, the programming voltage of 5V is applied to all bit lines $D_1$ through $D_n$ in the memory cell array 1 simultaneously, and all word lines $W_1$ through $W_m$ are biased simultaneously to a predetermined voltage (e.g., 2V) less than the reading voltage (e.g., 5V) which is set when the word lines are read-out. Since the VTM of an over-erased cell is relatively low, if the control gate of the over-erased cell is biased to 2V, a channel current will flow, and the channel hot electrons induced by the channel current will be poured into the floating gate, so that the VTM gradually rises, as explained above. The rise in the threshold voltage VTM of the memory cell continues during the time a cell in the over-erased state is turned "on" and a channel current flows. When the VTM has risen to the word line voltage (2V), the cell is turned "off" and the rise in VTM is stopped.

On the other hand, as mentioned above, because the VTM of a normal cell is high (e.g., 3V), the cell is not turned "on" even if the control gate is biased to 2V. Therefore, a channel current does not flow and channel hot electrons are not induced in the normal cell. Thus, the VTM will not vary during the over-erasion correction writing period.

Thus, the control circuit 7 controls so that a programming voltage (within the range of approximately 3 to 8V, e.g., approximately 5V) is applied to the bit lines of the memory cell array and a lower voltage (approximately 2V) is applied to the word lines of the memory cell array. The lower voltage is selected to be less than the threshold voltage (e.g., 3V) for a normal cell such that normal cells are not affected. However, the cells in an over-erased state will become active by the lower threshold voltage and begin conducting, thereby causing a channel current to flow to the over-erased memory cells. Channel hot electrons induced by this channel flow into the floating gate of the memory cell raise the threshold voltage (VTM) of the memory cell to a normal level.

Third Embodiment

Figure 4B:
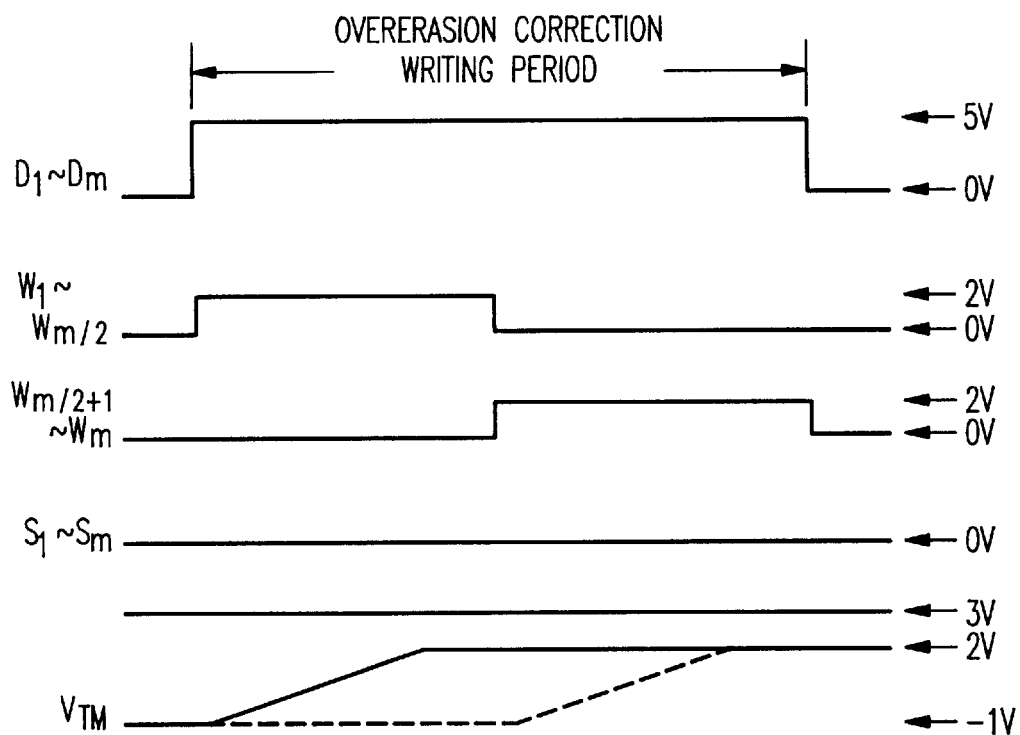
FIG. 4B is a timing diagram for explaining a processing operation of repairing an over-erased cell in a third embodiment of the present invention.
Figure 4A:
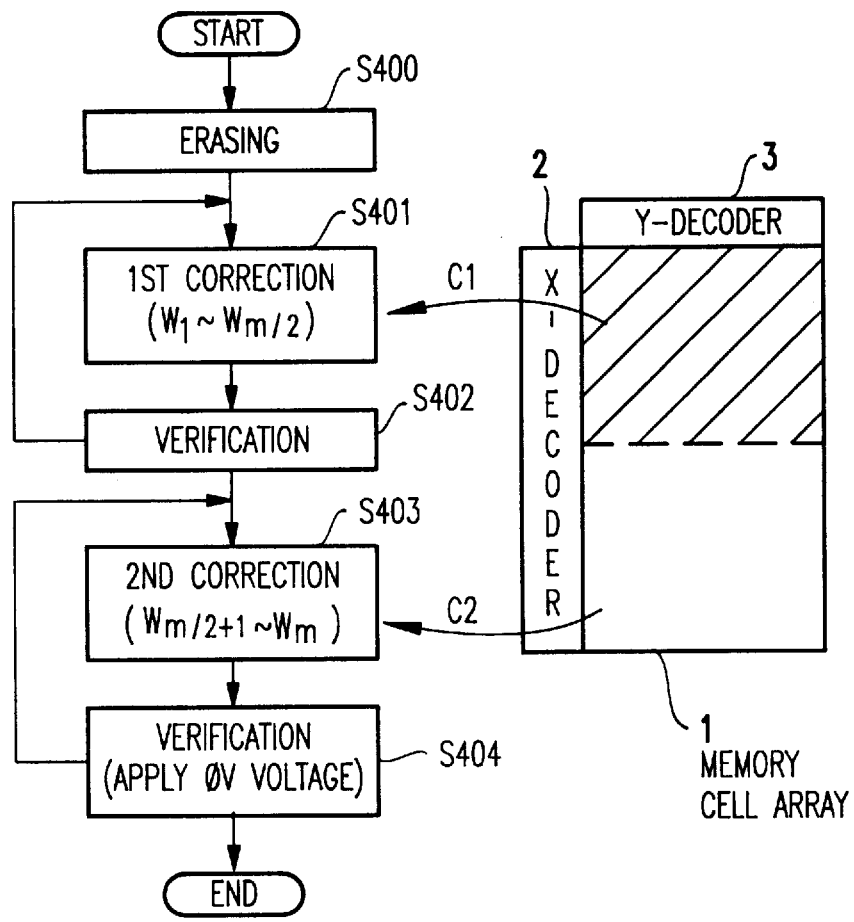
FIG. 4A is a flow diagram showing a processing sequence of redressing (e.g., repairing) an over-erased cell in a third embodiment of the present invention.
Figure 4C:
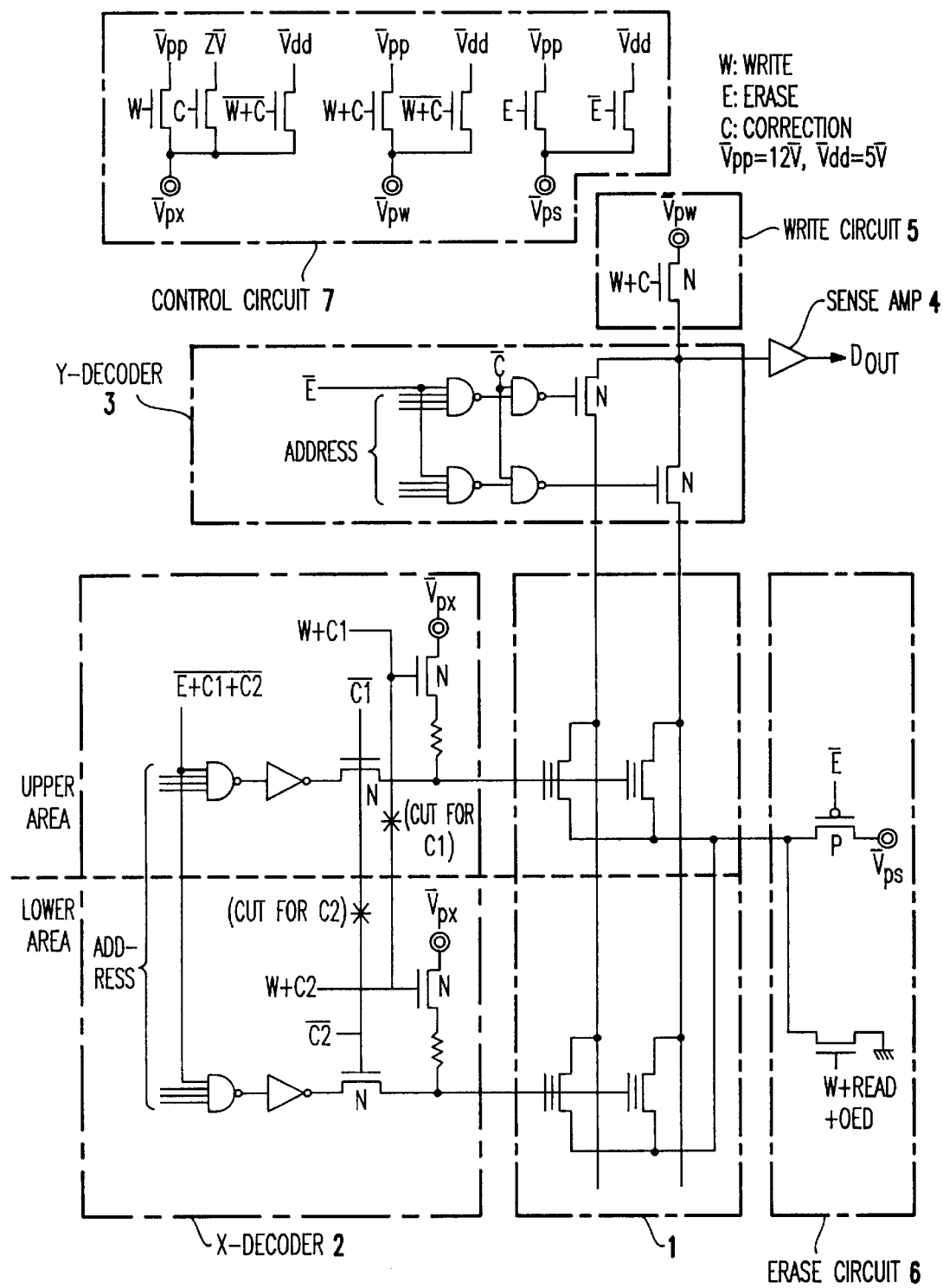
FIG. 4C is an exemplary circuit diagram of the structure for controlling and performing the method according to the third embodiment of the present invention.

FIG. 4A is a flowchart for illustrating a third embodiment of the present invention, FIG. 4B is a timing chart for explaining a third embodiment of the present invention, and FIG. 4C illustrates an exemplary circuit diagram for the structure according to the third embodiment of the present invention. A key feature of the third embodiment is that the word lines are divided into predetermined fractions for correction.

Referring to FIGS. 4A–4C, first, in step S400 all of the memory cells are erased, as discussed above. Thereafter, a high voltage (e.g., 5V) is applied to all bit lines ($D_1$ through $D_n$) during an over-erasion correction writing period.

The over-erasion correction writing period is divided into predetermined fractions, with cells connected to word lines being processed in each fraction. During a first fraction (e.g., a first half as shown in FIG. 4A) of the over-erasion correction writing period, a fraction (e.g., half) of the word lines (for example, including $W_1$ through $W_m/2$; however it does not matter which portion or half is selected, or if a lesser fraction of the word lines is selected) are biased to less than a voltage (e.g., 2V) which is set when the word lines are read-out (step S401), and the remaining fraction(s) (including word lines $W_m/2+1$ through $W_m$) are biased to be set to a non-selected state. With this arrangement, current flows through the cells in the over-erased state, connected to the word lines ($W_1$ through $W_m/2$), and the over-erased state of the upper area of the memory cell array 1 is corrected.

As discussed above, a verification step is performed typically after an over-erasure correction writing period (Step S402).

In step S403, the remaining fraction (e.g., half) of cells connected to word lines is corrected. During the second half of the over-erasion correction writing period, the remaining half of the word lines ($W_m/2+1$ through $W_m$) are biased to less than a voltage (for example, 2V) which is set when the word lines are read-out, and the word lines ($W_1$ through $W_m/2$), are set to a non-selected state (e.g., 0V). With this arrangement, current flows through the cells in the over-erased state, connected to the word lines ($W_m/2+1$ through $W_m$), and the over-erased state is corrected. It is noted that the signal line receiving the inverted C1 and C2 signals in the X-Decoder shown in FIG. 4C is effectively "cut" for C2 (the second correction) (shown in the area of the X-decoder 2 for processing the lower address portion of the memory cell array 1), whereas the signal line receiving W+C1 in the X-decoder 2 is effectively "cut" for C1 (the first correction) (shown in the area of the X-decoder for processing the upper address portion of the memory cell array 1) under the control of the control circuit 7.

Finally in S404, another verification process may be performed by applying, for example, 0V to the cells.

According to the third embodiment, the over-erased cells connected to the word lines in the memory cell array are divided into, for example, a plurality of fractions (e.g., two) and are redressed (repaired), so that the current flowing during the over-erasion correction writing period can be reduced in half. Thus, the width of the voltage source/GND wiring can also be reduced in half, and the chip area reduced. As mentioned above, the cell array can be divided into other fractions besides one-half (e.g., ⅓, ¼, . . . etc.) and the above-described method of the third embodiment would be modified simply to have three, four . . . etc. over-erasion correction operations.

In this embodiment, all over-erased cells existing in the memory cell array can be redressed with two (e.g., the number of fractions of divided word lines) over-erasion correction writing operations. Therefore, as compared with the conventional methods in which the tunneling phenomenon is used or an over-erased cell is redressed for each bit, the redressing of over-erased cells will be completed more quickly. Therefore, in this embodiment, high-speed redressing of over-erased cells is performed with a reduction in the chip area.

According to the present invention, as described above, over-erasion correction writing is performed by applying a high voltage to bit lines and biasing word lines with a voltage less than that normally used to read-out the word lines. Therefore, even in a large nonvolatile semiconductor memory, the present invention is advantageous since an over-erased cell can be corrected quickly, the control circuit becomes structurally simple, and the chip area is reduced.

Figure 5A:
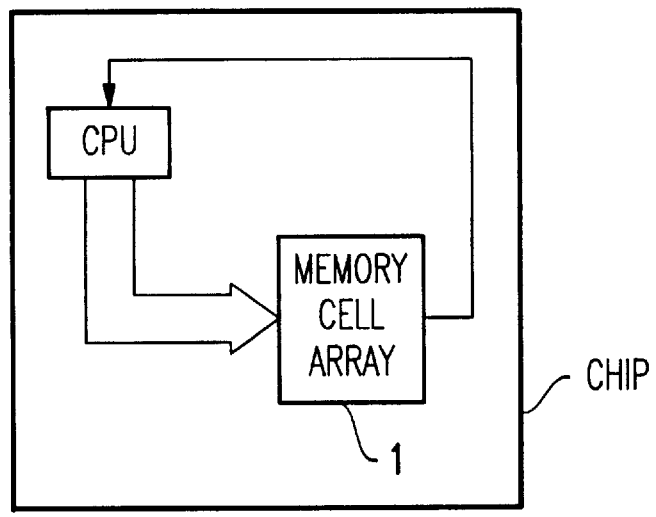
FIG. 5A illustrates the apparatus and method of the present invention implemented on a chip with an internal CPU.
Figure 5B:
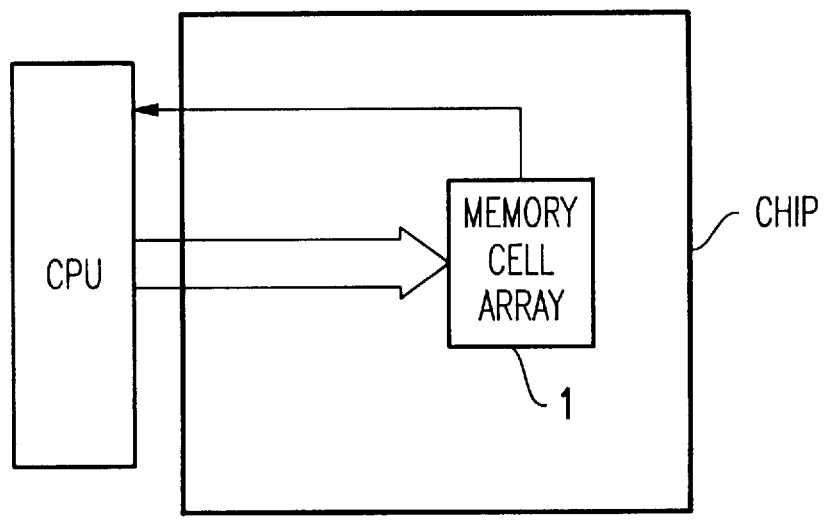
FIG. 5B illustrates the apparatus and method of the present invention implemented with an external CPU (off-chip)

Furthermore, the method and apparatus can be implemented not only in a chip with the CPU thereon, but also could be incorporated with an external CPU. For example, FIG. 5A illustrates the inventive circuit/method implemented in a chip with an on-board CPU, whereas FIG. 5B illustrates the inventive circuit/method incorporated with an external CPU (off-chip).

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A nonvolatile semiconductor memory, comprising:
   a plurality of memory cells arrayed in row and column directions;
   a plurality of first lines for connecting said memory cells in the row direction;
   a plurality of second lines for connecting said memory cells in the column direction;
   an erase circuit for erasing data written to said memory cells; and
   a controller for simultaneously applying a first voltage to said plurality of second lines and simultaneously biasing said plurality of first lines to a second voltage less than a voltage which is set when the first lines are read out.

2. A nonvolatile semiconductor memory according to claim 1, wherein said controller further includes a unit for detecting an over-erased memory cell.

3. A nonvolatile semiconductor memory according to claim 2, wherein said controller detects an over-erased memory cell before applying a voltage thereto.

4. A nonvolatile semiconductor memory according to claim 2, wherein said controller applies a voltage to said over-erased memory cell before detecting said over-erased memory cell.

5. A nonvolatile semiconductor memory according to claim 1, wherein said controller divides said memory cells into a plurality of predetermined fractions, and simultaneously applies a voltage to a first predetermined fraction of said plurality of predetermined fractions of said memory cells before simultaneously applying said voltage to a second predetermined fraction of said plurality of predetermined fractions of said memory cells.

6. A nonvolatile semiconductor memory as recited in claim 1, wherein said plurality of memory cells comprise electrically writeable and erasable memory cells each having a floating gate, said memory further comprising:
   an X-decoder for selecting said first lines with an address signal as an input;
   a Y-decoder for selecting said second lines with the address signal as an input;
   a sense amplifier for reading out data stored in said memory cells; and
   a write circuit for writing data to said memory cells in accordance with input data,
   wherein said first voltage is approximately 5 volts.

7. A nonvolatile semiconductor memory as recited in claim 1, wherein said first lines comprise word lines and said second lines comprise bit lines, and
   wherein said second voltage is approximately 2 volts.

8. A nonvolatile semiconductor according to claim 1, wherein said nonvolatile semiconductor memory is implemented in a chip with an on-chip central processing unit.

9. A nonvolatile semiconductor according to claim 1, wherein said nonvolatile semiconductor memory is implemented in a chip with an external central processing unit.

10. A nonvolatile semiconductor memory as recited in claim 1, further comprising:
    a unit for simultaneously applying a predetermined voltage to all of said plurality of second lines, for segmenting said memory cell array into a plurality of blocks in said second line directions, for sequentially biasing said first lines of each block to less than a voltage which is set when said first lines are read out at a same time, wherein, within a given block, said first lines are simultaneously biased, and for repairing memory cells in an over-erased state, which exist within said blocks, in units of said block.

11. A nonvolatile semiconductor memory, comprising:
    a memory cell array including a plurality memory cells arrayed in first and second directions;
    a plurality of first lines for connecting said memory cells in the first direction;
    a plurality of second lines for connecting said memory cells in the second direction; and
    a controller for simultaneously applying a first voltage to said plurality of second lines and for simultaneously biasing said plurality of first lines to a second voltage so that threshold voltages (VTM) of memory cells in an over-erased state rise to that of a memory cell in a non-over-erased state, said second voltage being less than a voltage used to read out a first line.

12. A nonvolatile semiconductor memory as recited in claim 11, wherein said first lines comprise word lines and said second lines comprise bit lines, further comprising:

an X-decoder for selecting said word lines with an address signal as an input;

a Y-decoder for selecting said bit lines with the address signal as an input;

a sense amplifier for reading out data stored in said memory cells;

a write circuit for writing data to said memory cells in accordance with input data; and an erase circuit for erasing data written to said memory cells, wherein said first voltage is in a range of approximately 3 to 8 volts.

13. A nonvolatile semiconductor memory as recited in claim 11, wherein said second voltage is in a range of approximately 0 to 3 volts.

14. A method of raising the threshold voltages of over-erased memory cells in a memory cell array, comprising steps of:

simultaneously applying a first voltage to a plurality of first lines in said memory cell array; and simultaneously applying a second voltage to a plurality of second lines in said memory cell array, said second voltage being less than a voltage threshold of a memory cell in a non-over erased state.

15. A method according to claim 14, wherein said first voltage is in a range of approximately 3 to 8 V.

16. A method according to claim 14, wherein said second voltage is in a range of approximately 0 to 3 V.

17. A method according to claim 14, wherein said first voltage is in a range of approximately 3 to 8 volts and wherein said second voltage is in a range of approximately 0 to 3 volts.

18. A method according to claim 14, further comprising a step of:

determining if an over-erased cell exists in said memory cell array prior to said steps of applying a first voltage and applying a second voltage.

19. A method according to claim 14, wherein said steps of applying said first voltage and applying said second voltage comprise steps of:

applying a first voltage and applying a second voltage without determining whether an over-erased cell exists in said memory cell array.

20. A method according to claim 14, further comprising steps of:

dividing said second lines into a first portion and a second portion;

simultaneously applying said second voltage to said first portion of said second lines for a predetermined time period; and simultaneously applying said second voltage to said second portion of said second lines for another of said predetermined time period.

21. A non-volatile semiconductor memory, comprising:

a memory cell block;

a plurality of word lines coupled to corresponding memory cells of said memory cell block;

a plurality of bit lines coupled to corresponding memory cells of said memory cell block;

an erasing circuit for erasing all data stored in said memory cell block; and an over-erasing correction circuit for applying a first voltage to all word lines, and applying a second voltage to all bit lines for flowing a current to an over-erased memory cell of said memory cell block in order to vary a threshold voltage of said over-erased memory cell.

22. The memory as claimed in claim 21, wherein said first voltage is lower in absolute value than a voltage applied to a selected one of said word lines when data of a selected memory cell is read-out.

23. The memory as claimed in claim 21, wherein said erasing circuit is operable during a first period, and said over-erasing correction circuit is operable during a second period following said first period.

24. A non-volatile semiconductor memory, comprising:

a first memory cell block;

a second memory cell block;

a plurality of first word lines coupled to corresponding memory cells of said first memory cell block;

a plurality of second word lines coupled to corresponding memory cells of said second memory cell block;

a plurality of first bit lines coupled to corresponding memory cells of said first memory cell block;

a plurality of second bit lines coupled to corresponding memory cells of said second memory cell block;

an erasing circuit for erasing all data stored in said first memory cell block and said second memory cell block in response to a first period and a second period, respectively; and an over-erasing correction circuit for applying a first voltage to all first word lines, and applying a second voltage to all first bit lines for flowing a current to a first over-erased memory cell of said first memory cell block in order to vary a threshold voltage of said first over-erased memory cell in a third period, and for applying said first voltage to all second word lines, and applying a second voltage to all second bit lines for flowing a current to a second over-erased memory cell of said second memory cell block in order to vary a threshold voltage of said second over-erased memory cell in a fourth period.

* * * * *